United States Patent [19]

Sugiyama et al.

[11] Patent Number: 5,892,685

[45] Date of Patent: Apr. 6, 1999

[54] PACKAGING DESIGN SYSTEM FOR AN LSI CIRCUIT

[75] Inventors: Hiroyuki Sugiyama; Terunobu Maruyama; Ryouichi Yamashita, all of Kawasaki, Japan

[73] Assignee: Fujitsu Limited, Kawasaki, Japan

[21] Appl. No.: 669,766

[22] Filed: Jun. 25, 1996

Related U.S. Application Data

[63] Continuation of Ser. No. 274,459, Jul. 13, 1994, abandoned.

[30] Foreign Application Priority Data

Sep. 28, 1993 [JP] Japan .................................. 5-241455

[51] Int. Cl.$^6$ ............................ G06F 17/00; G06F 17/50
[52] U.S. Cl. ........................ 364/490; 364/489; 364/491
[58] Field of Search ..................................... 364/489–491, 364/488, 490; 395/550; 307/607

[56] References Cited

U.S. PATENT DOCUMENTS

| | | | |
|---|---|---|---|
| 4,698,760 | 10/1987 | Lembach et al. ........................ | 364/490 |
| 4,754,408 | 6/1988 | Carpenter et al. ...................... | 364/491 |
| 4,805,113 | 2/1989 | Ishii et al. .............................. | 364/491 |
| 4,916,627 | 4/1990 | Hathaway ............................... | 364/490 |
| 4,924,430 | 5/1990 | Zasio et al. ............................ | 364/578 |
| 4,967,367 | 10/1990 | Piednoir ................................. | 364/489 |
| 5,077,676 | 12/1991 | Johnson et al. ......................... | 364/489 |
| 5,218,551 | 6/1993 | Agrawal et al. ........................ | 364/491 |
| 5,220,660 | 6/1993 | Yoshizawa et al. .................... | 395/550 |
| 5,237,514 | 8/1993 | Curtin .................................... | 364/490 |
| 5,243,240 | 9/1993 | Murakami et al. ..................... | 307/603 |
| 5,333,032 | 7/1994 | Matsumoto et al. .................... | 364/489 |
| 5,365,463 | 11/1994 | Donath et al. .......................... | 364/578 |
| 5,367,469 | 11/1994 | Hartoog ................................. | 364/491 |
| 5,452,228 | 9/1995 | Arakawa et al. ....................... | 364/489 |
| 5,461,576 | 10/1995 | Tsay et al. .............................. | 364/490 |
| 5,469,366 | 11/1995 | Yang et al. .............................. | 364/489 |
| 5,475,607 | 12/1995 | Apte et al. .............................. | 364/489 |
| 5,576,969 | 11/1996 | Aoki et al. .............................. | 364/491 |
| 5,648,913 | 7/1997 | Bennett et al. ......................... | 364/491 |

OTHER PUBLICATIONS

Wolff, Sr. et al., "Power/Timing: Optimization and Layout Techniques for LSI Chips", IBM, pp. 145–164, 1978.

Hauge et al., "Circuit Placement for Predictable Performance", IEEE, pp. 88–91, 1987.

Ren–Song Tsay "An Exact Zero–Skew Clock Routing Algorithm," IEEE, pp. 242–249. Feb. 1993.

Jackson et al "Estimating and Optimization RC Interconnect Delay During Physical Design," IEEE, pp. 869–871. May 1990.

*Primary Examiner*—Kevin J. Teska
*Assistant Examiner*—Vuthe Siek
*Attorney, Agent, or Firm*—Nikaido, Marmelstein, Murray & Oram LLP

[57] ABSTRACT

A packaging design system for an LSI circuit includes: a gate placement preparation unit for preparing basic placement data for gates used as an original data for producting the LSI circuit; a wiring data preparation unit operatively connected to the gate placement preparation unit for preparing wiring data based on wiring patterns each having the same length between gates; a delay calculation unit operatively connected to the wiring data preparation unit for calculating net delays between gates and path delays from a clock input until an output in the LSI circuit; a standard path delay determining unit operatively connected to the delay calculation unit for determining a standard path delay in accordance with distribution of path delays; and a macro determining unit operatively connected to the standard path delay determining unit for selecting the macros in accordance with predetermined conditions of path delays, and selected several macros being used for an actual placement of gates.

7 Claims, 6 Drawing Sheets

PACKAGING DESIGN SYSTEM FOR AN LSI CIRCUIT

This application is a continuation of application Ser. No. 08/274,459 filed Jul. 13, 1994 now abandoned.

BACKGROUND OF THE INVENTION

1. Field of the Invention

The present invention relates to a packaging design system for an LSI circuit, and provides advantages in designing LSI circuit that were not previously available.

2. Description of the Related Art

In general, an LSI (Large Scale Integrated) circuit includes a plurality of gates (AND gates, OR gates, flip-flop circuits, registers, etc.). When transferring data among a plurality of gates, the data are transferred in response to clock signals that are input into the gates. In this case, in order to synchronizes the data at one output terminal with other data at other output terminals, it is necessary that all propagation delays (below, path delays) of the clock signals are the same among all gates.

In a conventional packaging design of an LSI circuit, two representative design methods are proposed in order to realize the minimum path delay. In a first method, a plurality of gates are arranged at locations where the path delays are previously known. In a second method, all "net lengths" ("net" refers to wires connecting gates) between gates are determined taking the path delay into consideration.

However, it is very difficult to employ both the first and second methods because a recently LSI circuits are formed of very many gates (perhaps more than several thousand gates), with very high packaging density, and very fine wiring patterns. Accordingly, it is very difficult to realize an LSI circuit having the minimum path delay. Minimum path delay can be expressed by a minimum skew value, and in general, the minimum skew value means the difference between a standard path delay and an actual path delay.

Further, in a conventional placement process for gates (so-called "floor plan") used in a CAD system, when a circuit designer prepares the gate placement data which are used as original data in the design of the LSI circuit, the registration processes of blocks formed by a plurality of basic gates (a block is called a "macro" in the CAD system) are separated from the preparation processes of placement areas. Finally, these processes are automatically performed using the CAD system.

However, since the blocks to be registered are previously known for clock transfer routes, scanning routes and OSL (Only Scan Latch) routes (the OSL route is used for only a test of the circuit), and since the placement areas are considered for all areas of the LSI chip, it is not necessary to separate these processes taking propagation delay of data within the LSI circuit into consideration.

SUMMARY OF THE INVENTION

The object of the present invention is to provide a packaging design system for an LSI circuit enabling the minimum path delay (i.e., the minimum skew value) of clock signals.

In accordance with the present invention, there is provided a packaging design system for an LSI circuit including: a gate placement preparation unit for preparing basic placement data for gates used as original data for producting the LSI circuit; a wiring data preparation unit operatively connected to the gate placement preparation unit for preparing wiring data based on wiring patterns each having the same length between gates; a delay calculation unit operatively connected to the wiring data preparation unit for calculating net delays between gates and path delays from a clock input to an output in the LSI circuit; a standard path delay determining unit operatively connected to the delay calculation unit for determining a standard path delay in accordance with the distribution of path delays; and a macro determining unit operatively connected to the standard path delay determining unit for selecting the macros in accordance with predetermined conditions of path delays, and the several selected macros being used for an actual placement of gates.

In a preferred embodiment, the gate placement preparation unit prepares a standard macro and several other kinds of macros, the standard macro having a standard logic circuit which is formed of a plurality of gates; the several other kinds of macros each having the same logic as the standard macro, but different input load capacitance and load drive ability from the standard macro; and the basic placement data being prepared by a plurality of standard macros in order to calculate the path delay.

In another preferred embodiment, the wiring data in the wiring data preparation means is called "equal length wiring".

In still another preferred embodiment, the net delays between gates being calculated based on delay time at each gate, floating capacitances between wires, resistances of wires, load capacitance, a load drive ability of a driver gate, etc.; these parameters being handled as a distributed constant circuit; and the path delays being calculated by tracing the path from the clock input pin to the output of the target register in the LSI circuit.

In still another preferred embodiment, the macro determining unit selects the macros having either small input load capacitance or high load drive ability when the net and path delays are set to a small value, and having either large input load capacitance or low load drive ability when the net and path delays are set to a large value, so as to become the minimum skew value.

In still another preferred embodiment, the net delay between the gates is determined by floating capacitances between an actual wire and dummy wires which are provided either along with the actual wire or in perpendicular to the actual wire.

In still another preferred embodiment, the net delay between the gates is determined by changing a diameter of the wire between gates.

DESCRIPTION OF THE PREFERRED EMBODIMENTS

Figure 1:
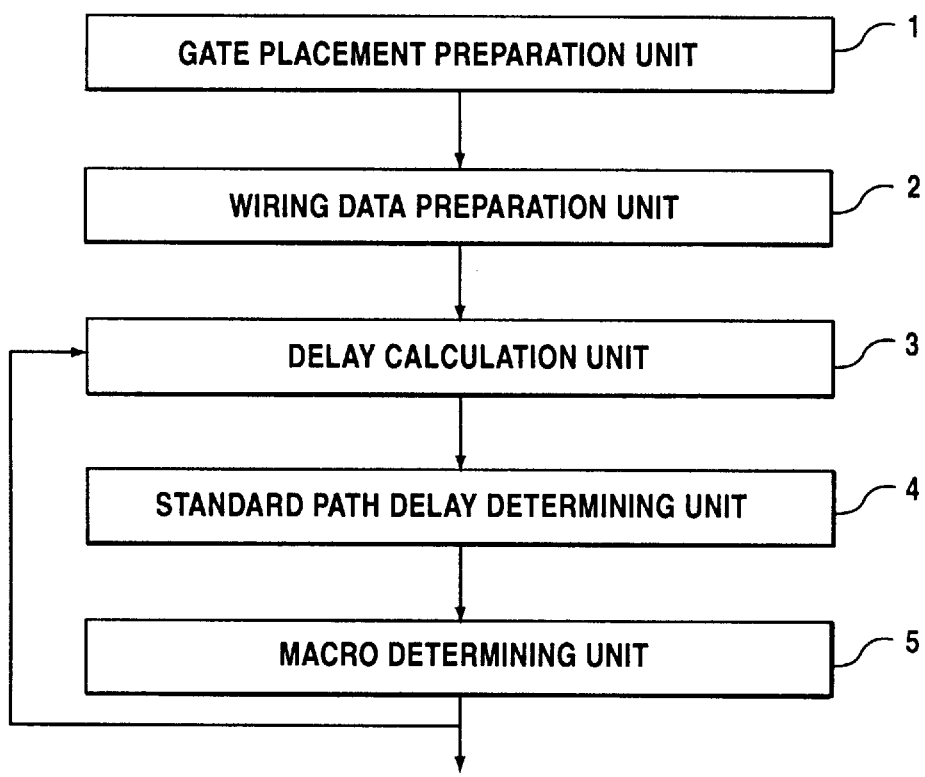
FIG. 1 is a basic block diagram of a packaging design system for an LSI circuit according to the present invention.

FIG. 1 is basic block diagram of a packaging design system for an LSI circuit according to the present invention.

As shown in FIG. 1, the packaging design system according to the present invention includes, a gate placement preparation unit 1, a wiring data preparation unit 2, a delay calculation unit 3, a standard path delay determining unit 4, and a macro determining unit 5.

The gate placement preparation unit 1 prepares basic placement data used as original data in the production of the LSI circuit. A standard macro and several other kinds of macros are provided in this unit 1. The standard macro has a standard logic circuit which is formed of a plurality of gates. Several other kinds of macros each have the same logic as the standard macro, but different input load capacitance and load drive ability from the standard macro. First, the basic placement data is prepared by a plurality of standard macros in order to calculate the path delay.

The wiring data preparation unit 2 prepares wiring data based on wiring patterns each having the same "net" length (i.e., so-called "equal length wiring") when connecting between gates.

The delay calculation unit 3 includes a first/second delay calculation units for calculating the net delay and the path delay. The first delay calculation unit calculates the net delay based on the delay time at each gate, floating capacitances between wires, resistances of wires, load capacitance, a load drive ability of a driver gate, etc. These parameters are handled as a distributed constant circuit. The second delay calculation unit calculates the path delay by tracing the path from the clock input pin until the target resister.

The standard path delay determining unit 4 determines the standard path delay in accordance with the distribution of the path delay.

The macro determining unit 5 selects the macros having either small input load capacitance or high load drive ability (when the net and path delays are set to small value) and having either large input load capacitance or low load drive ability (when the net and path delay are set to large value) so as to become the minimum skew value (i.e., minimum difference between the standard path delay and the target path delay). The several macros are selected in accordance with the result of the above conditions, and selected macros are used for the actual placement of gates.

Figure 2:
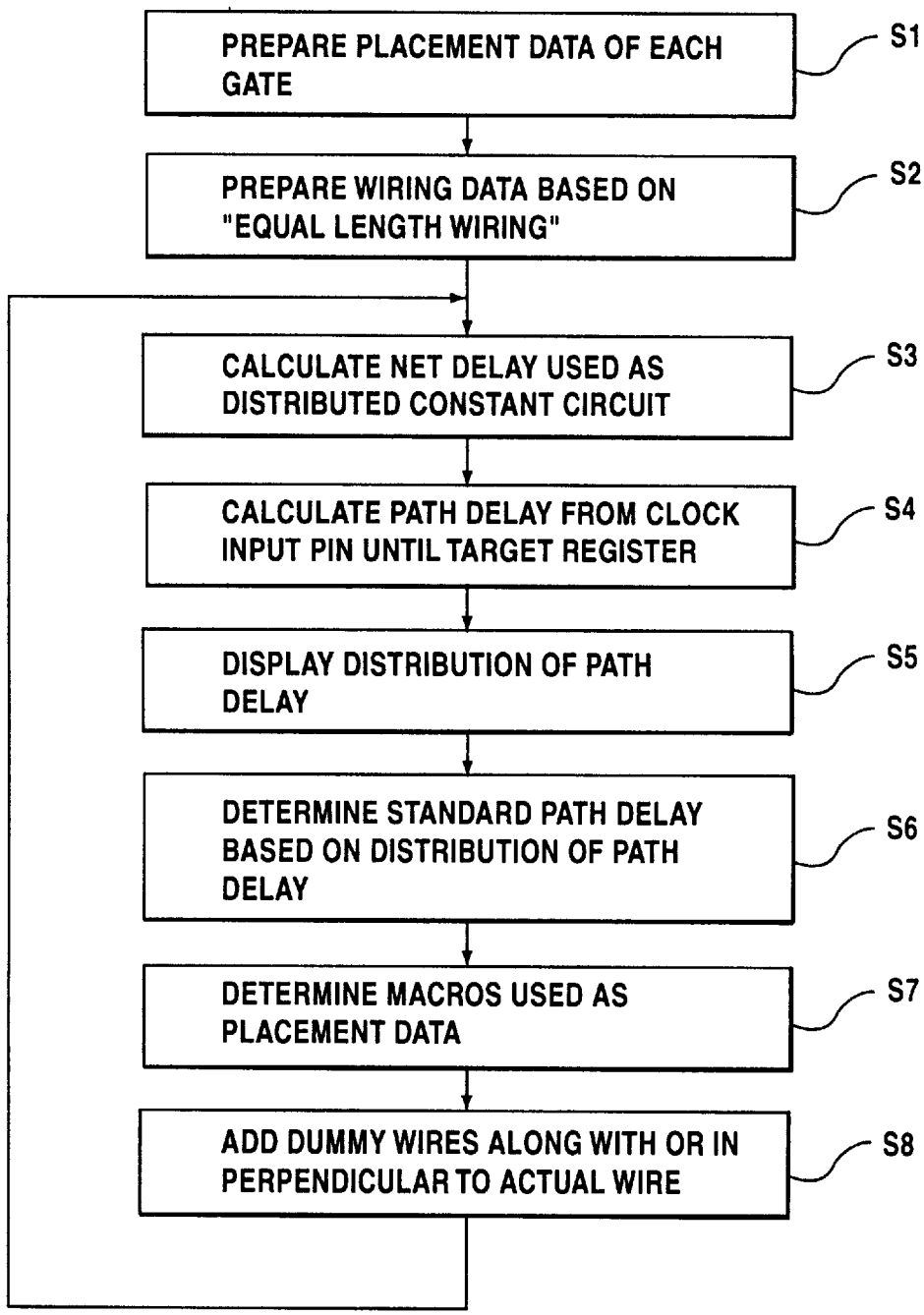
FIG. 2 is a process flow chart in the packaging design system shown in FIG. 1.

FIG. 2 is a process flow chart in the packaging design system shown in FIG. 1. In step S1, the gate placement preparation unit 1 prepares the placement data of each gate. In step S2, the wiring data preparation unit 2 prepares wiring data in accordance with the "equal length wiring" when connecting between gates. In step S3, the first delay calculation unit calculates the net delay used as the distributed constant circuit. In step S4, the second calculation unit calculates the path delay from the clock input pin to the target register.

Figure 3:
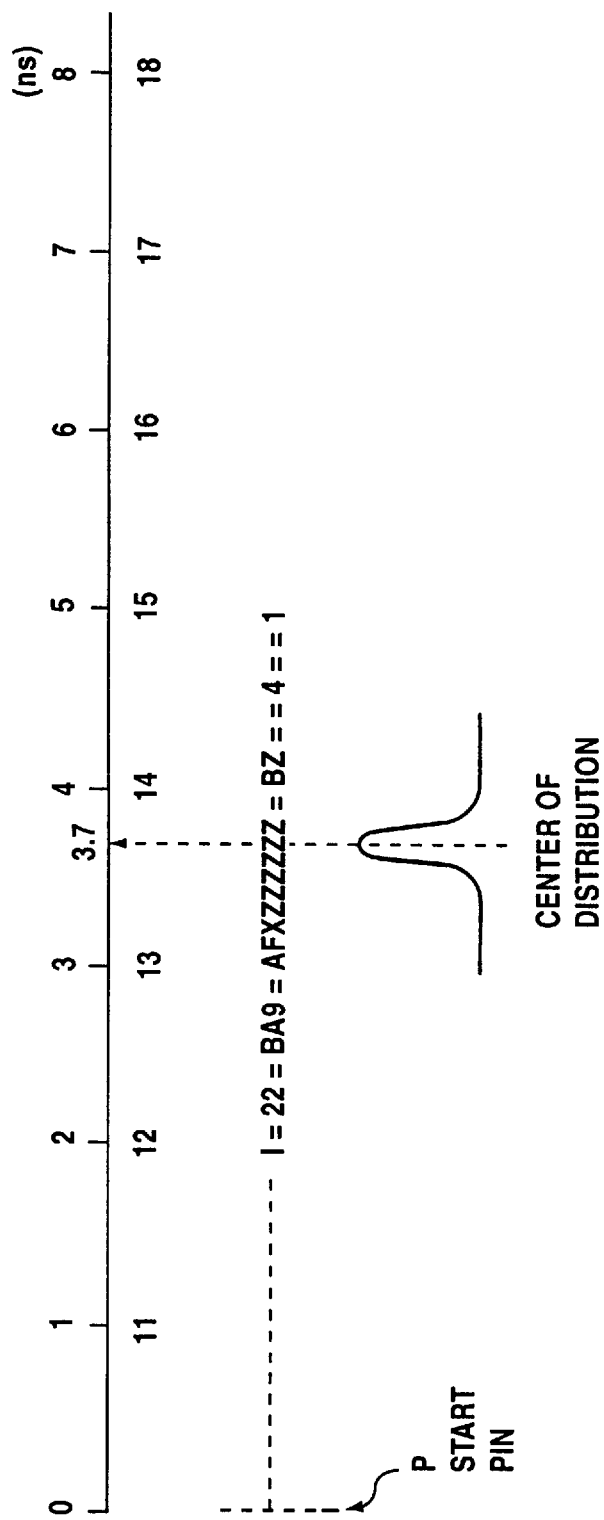
FIG. 3 is an explanatory view of the distribution of path delay.

In step S5, the second delay calculation unit prepares and displays distribution of the path delay as shown in FIG. 3. In step S6, the standard path delay determining unit 4 determines a standard path delay in accordance with the distribution of path delays shown in FIG. 3. The standard path delay is determined in the vicinity of the center of the distribution. For example, since four nanoseconds (4 ns) is close to the center of the distribution (3.7 ns), this four nanoseconds is determined as the standard path delay.

In step S7, the macro determining unit 5 selects the macros having either small input load capacitance or high load drive ability (when the net and path delays are set to a small value) and having either large input load capacitance or low load drive ability (when the net and path delays are set to a large value) so as to become the minimum skew value. The several macros are selected in accordance with the result of the above conditions, and selected macros are used for the actual placement of gates. In step S8, dummy wires are added to an actual wire (i.e., "net" between gates) along with or in perpendicular to the actual wire as shown in FIG. 3. The dummy wires are not used for transfer of signals and data, but only used for the floating capacitance.

FIG. 3 is an explanatory view of distribution of path delay. The abscissa denotes the path delay time (nanoseconds: ns). The upper scale indicates the delay times up to eight nanoseconds, and the lower scale indicates delay time up to eighteen nanoseconds. "p" denotes a start pin for the path trace. Further, 1 to 9, "A", "B", "F", "I", "X", and "Z" indicate the numbers of the path delay at each delay time. In this case, characters "A"=10, "B"=11, "F"=15, "I"=18, "X"=33, and "Z"=35. The number of the path delay which exceeds "35" is expressed by the same character "Z". Still further, the symbol "=" denotes "no path delay" at that delay time.

Accordingly, it is obvious that the center of the distribution exists in the vicinity of the delay time 3.7 ns.

Figure 4A:
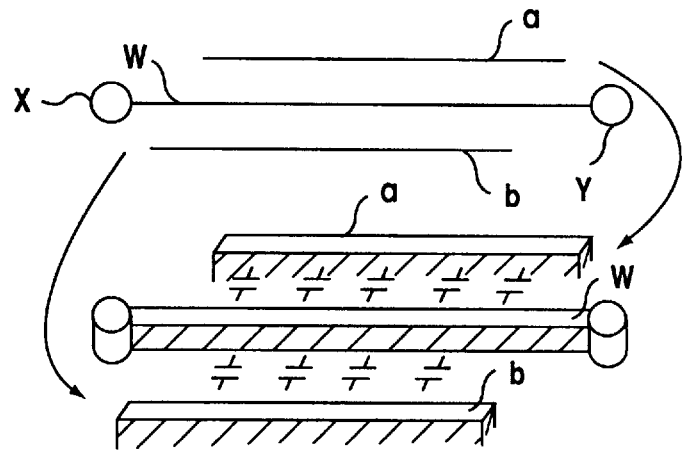
FIGS. 4A to 4C are explanatory views for capacitances between wires.
Figure 4B:
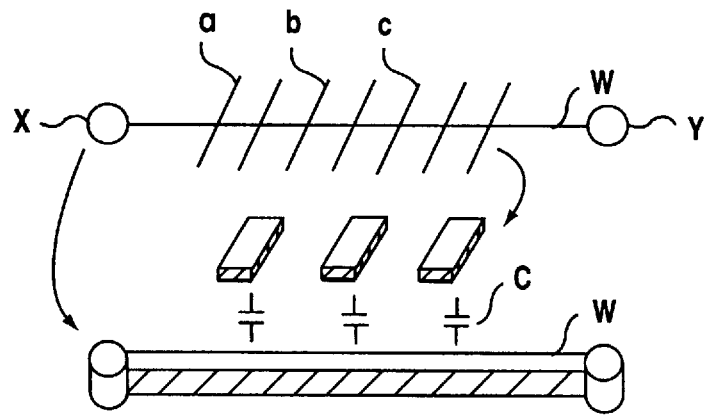
Figure 4C:
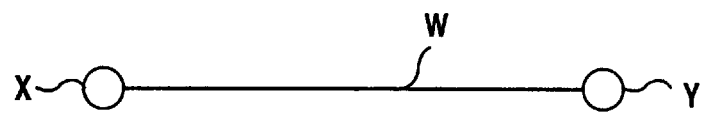

FIGS. 4A to 4C are explanatory views for explaining capacitances between wires. In these drawings, W denotes the actual wire (target wire) used as the data and signal transfer in the actual circuit. Reference letters "a", "b" and "c" denote wires which are not used as the data and signal wires in the actual circuit (below, dummy wires). Further, the symbol C denotes the floating capacitance between the actual wire W and the dummy wires.

As shown in FIG. 4A, the dummy wires "a" and "b" are provided in parallel to the actual wire W in the same wiring layer. Accordingly, it is possible to control an amount of the floating capacitance between the actual wire W and the dummy wires "a", "b", "c". As shown in FIG. 4B, the dummy wires "a", "b" and "c" are provided in perpendicular to the actual wire W in another wiring layer. Accordingly, it is possible to control the amount of floating capacitance between the actual wire W and the dummy wire. As shown in FIG. 4C, in this case, the dummy wires are not provided, and the thick wire is used for controlling the resistance of the actual wire. As is obvious, the diameter of the thick wire is used for controlling the resistance.

Figure 5A:
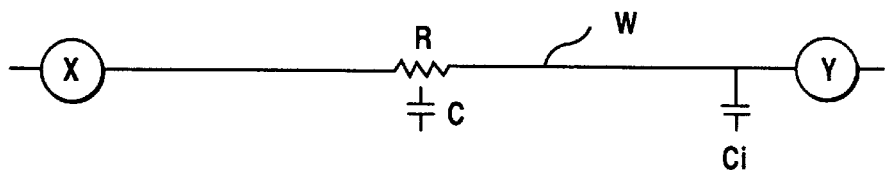
FIGS. 5A to 5C are explanatory views for a distributed constant circuit used in the present invention.
Figure 5B:
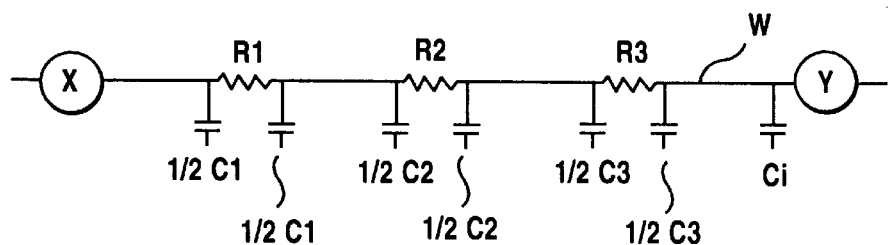
Figure 5C:
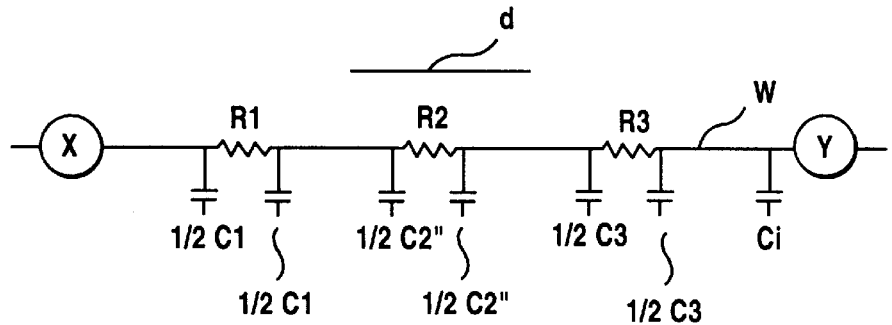

FIGS. 5A to 5C are explanatory views for explaining the distributed constant circuit used in the present invention. In FIG. 5A, reference letter C denotes the floating capacitance at the resistor R, and Ci denotes a capacitance at an input pin (below, input pin capacitance). In FIG. 5B, reference letters C1, C2 and C3 denote capacitances at the resistors R1, R2 and R3, respectively. All resistors R1, R2 and R3 are equal to each other and have the resistance value $\frac{1}{3}R$. All capacitors C1, C2 and C3 are equal to each other and have the capacitance value $\frac{1}{3}C$. In FIG. 5C, reference letter "d" denotes another wire provided along with the main wire W, and C" denotes capacitance which is changed by the other wire "d".

It is assumed that the circuit shown in FIG. 5A is a distributed constant circuit. Accordingly, the resisters and capacitors of the distributed constant circuit are shown by FIG. 5B. The net delay T between the gates X and Y is expressed by the following formula.

$$T = R1(\tfrac{1}{2}C1 + C2 + C3 + Ci) + R2(\tfrac{1}{2}C2 + C3 + Ci) + R3(\tfrac{1}{2}C3 + Ci) \quad \ldots (1)$$

As shown in FIG. 5C, when another wire "d" is provided along with the wire W, the floating capacitance C2 at the resistor R2 becomes larger than the floating capacitance C2 of FIG. 5B. That is, the capacitance C2" is larger than the capacitance C2" of FIG. 5B so that the wiring delay T also increases.

Figure 6:
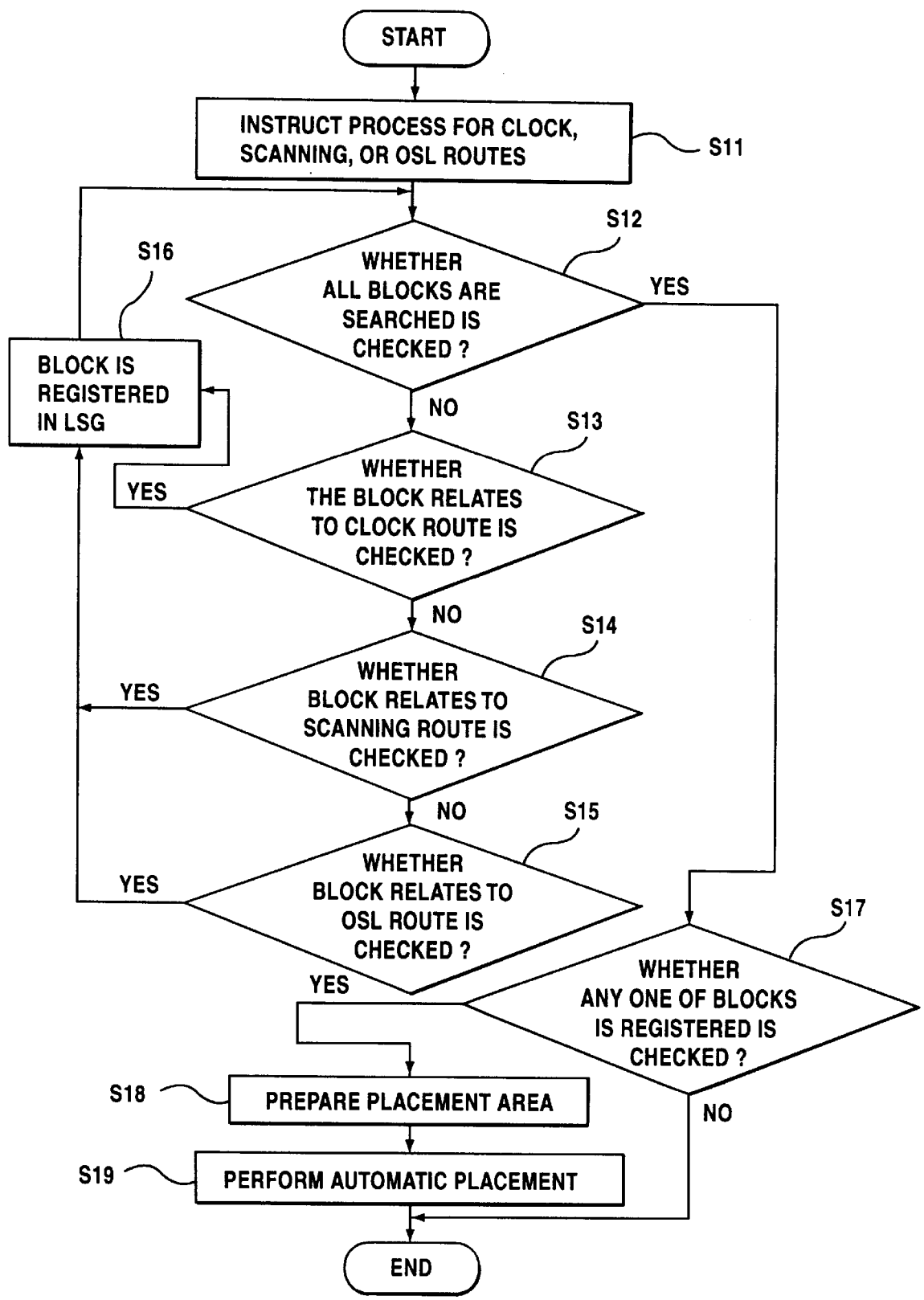
FIG. 6 is a process flow chart for an automatic placement of gates.

FIG. 6 is a process flow chart for an automatic placement of gates. This flow chart is used in the gate placement preparation unit 1 shown in FIG. 1. In step S11, any one of routes, i.e., either the clock operation route, the scanning operation route, or the OSL route is selected. In step S12, whether all blocks (i.e., macros) are searched is checked. In step S13, if the result is "NO", whether the block relates to the clock operation route is checked. In step S14, when the result is "NO", whether the block relates to the scanning operation route is checked. In step S15, when the result is "NO", whether the block relates to the OSL operation route is checked.

In step S16, when the result of the steps S13 to S15 are "YES", the block is registered in a LSG (Layout Sub Group). That is, for example, when the instruction is the scanning operation route, the block data is registered in the LSG as the scanning operation route. In step S17, when the result is "YES" in step S12, whether any one of blocks is registered is checked. In step S18, when the result is "YES" in step S17, the placement areas are prepared. In step S19, when the placement areas are determined, all processes are automatically handled by using the CAD system so as to realize the minimum skew value between wires.

We claim:

1. A packaging design system for an LSI circuit comprising:

a gate placement preparation means for preparing basic placement data for gates used as original data for producing the LSI circuit;

a wiring data preparation means operatively connected to the gate placement preparation means for preparing wiring data based on wiring patterns each having the same length between gates;

a delay calculation means operatively connected to the wiring data preparation means for calculating net delays between gates and path delays from a clock input to an output in the LSI circuit, wherein the net delays between gates are calculated based on delay time at each gate and floating capacitances between wires, with the these parameters being handled as a distributed constant circuit;

a standard path delay determining means operatively connected to the delay calculation means for determining a standard path delay in accordance with a distribution of path delays, with the path delays being calculated by tracing the path from the clock input pin to the output of the target register in the LSI circuit, wherein a wiring width of an actual wiring of the wiring patterns, an adjacent wiring, and dummy wires are used to determine the net delay between the gates by changing a capacitance between the actual wiring, the adjacent wiring, and the dummy wires; and a macro determining means operatively connected to the standard path delay determining means for selecting the macros in accordance with predetermined conditions of path delays, and several selected macros being used for an actual placement of gates.

2. A packaging design system as claimed in claim 1, wherein said gate placement preparation means prepares a standard macro and several other kinds of macros, the standard macro having a standard logic circuit which is formed of a plurality of gates; the several other kinds of macros each having the same logic as the standard macro, but different input load capacitance and load drive ability from the standard macro; and the basic placement data being prepared by a plurality of standard macros in order to calculate the path delay.

3. A packaging design system as claimed in claim 1, wherein said wiring data in the wiring data preparation means is equal length wiring.

4. A packaging design system as claimed in claim 1, wherein the net delays between gates are calculated based on resistances of wires, load capacitance, and a load drive ability of a driver gate with these parameters being handled as a distributed constant circuit.

5. A packaging design system as claimed in claim 1, wherein said macro determining unit selects the macros having either small input load capacitance or high load drive ability when the net and path delays are set to a small value, and having either large input load capacitance or low load drive ability when the net and path delays are set to a large value, so as to become the minimum skew value.

6. A packaging design system as claimed in claim 1, wherein the net delay between the gates is determined by floating capacitances between an actual wire and dummy wires which are provided either along with the actual wire or in perpendicular to the actual wire.

7. A packaging design system as claimed in claim 1, wherein the net delay between the gates is determined by changing a diameter of the wire between gates.

* * * * *